(12) United States Patent
Beach (10) Patent No.: US 7,704,871 B2
(45) Date of Patent: Apr. 27, 2010

(54) INTEGRATION OF THIN FILM RESISTORS HAVING DIFFERENT TCRS INTO SINGLE DIE

(75) Inventor: Eric W Beach, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/016,313

(22) Filed: Jan. 18, 2008

(65) Prior Publication Data

US 2008/0132056 A1    Jun. 5, 2008

Related U.S. Application Data

(62) Division of application No. 11/135,897, filed on May 24, 2005, now Pat. No. 7,345,573.

(51) Int. Cl.
*H01L 21/4763* (2006.01)

(52) U.S. Cl. .................. 438/620; 438/329; 438/384; 257/295; 257/757; 338/9

(58) Field of Classification Search .......... 438/171, 438/190, 210, 231, 329–330, 381–382, 384; 338/307–309, 9, 226, 330, 333; 257/295, 257/363, 516, 757

See application file for complete search history.

(56) References Cited

U.S. PATENT DOCUMENTS 6,703,666 B1 * 3/2004 Huttemann et al. ......... 257/359
7,217,981 B2 * 5/2007 Coolbaugh et al. ......... 257/380

* cited by examiner

*Primary Examiner*—Kyung Lee
(74) *Attorney, Agent, or Firm*—Warren L. Franz; Wade J. Brady, III; Frederick J. Telecky, Jr.

(57) ABSTRACT

An integrated circuit structure including multiple thin film resistors having different sheet resistances and TCRs includes a first oxide layer (2) formed on a semiconductor substrate (1), a first thin film resistor (3) disposed on the first oxide layer (2), and a second oxide layer (14) disposed over the first oxide layer (2) and first thin film resistor (3). A second thin film resistor (15) is formed on the second oxide layer (14) and a third oxide layer (16) is formed over the second thin film resistor (15) and the second oxide layer (14). Interconnect metallization elements (12A,B & 22A,B) disposed on at least one of the second (14) and third (16) oxide layers electrically contact the circuit element (4), terminals of the first thin film resistor (3), and terminals of the second thin film resistor (15), respectively, through corresponding contact openings through at least one of the second (14) and third (16) oxide layers.

17 Claims, 11 Drawing Sheets

INTEGRATION OF THIN FILM RESISTORS HAVING DIFFERENT TCRS INTO SINGLE DIE

This application is a divisional application of application Ser. No. 11/195,283 filed on Aug. 2, 2005 (now pending) entitled Integrated Circuit Having a Top Side Wafer Contact and a Method of Manufacture Therefor.

BACKGROUND OF THE INVENTION

The present invention relates generally to practical thin film resistor structures and methods for integrating multiple thin film resistors of the same or different sheet resistances and the same or different temperature coefficients of resistance, and to providing a practical means of adjusting the temperature coefficient of integrated circuit components.

Design engineers would be able to better optimize some integrated circuit designs if it were practical and economical to integrate thin film resistors having various sheet resistances and TCRs (temperature coefficients of resistance) into a single integrated circuit structure. However, there has been no practical, economical way to accomplish this because temperature processing cycles associated with forming subsequent thin film resistor layers subsequent to formation of a first thin film resistor layer would cause a variety of difficult integrated circuit processing problems. For example, controlling the effect of various thermal cycles on the sheet resistances and TCRs of the multiple thin film resistors formed on successive oxide layers may be very difficult. Also, the presence of metallization layers in integrated structures including thin film resistors on multiple layers may make it very difficult to design subsequent thermal cycles of the kind needed to be compatible with the thin film resistor properties. Design engineers frequently find it desirable to use a resistor having a large positive TCR to offset a negative TCR of a another circuit element. However, there has been no practical way of providing high-precision thin film resistors having positive TCRs in typical integrated circuit structures.

U.S. Pat. No. 4,019,168 entitled "Bilayer of Thin Film Resistor and Method for Manufacture", issued Apr. 19, 1977 to Franklyn M. Collins, describes an integrated circuit structure including a layer of tantalum on a layer of nichrome for the purpose of stabilizing the sheet resistance of the nichrome. However, the foregoing patent is not directed to issues regarding the TCR of thin film resistors.

It is conventional to adjust the thickness or sheet resistance of a resistive thin film layer by using suitable thermal anneal cycles to achieve a target sheet resistance and a target TCR for a deposited SiCr layer. Empirical curves have been developed that represent the relationships between the TCR and sheet resistance of various resistive thin film materials as functions of various integrated circuit processing parameters, such as the type of resistive material, thermal cycle temperatures and durations, etc. Once the sheet resistance of a thin film layer is known, the amount of annealing needed to increase its TCR by a desired amount can be determined from the curves. However, the technique of using thermal cycles to obtain a TCR target value that is precisely equal to zero or other value is not practical for some materials and for some sheet resistances, especially for SiCr, and especially for making very low resistance thin film resistors which are very wide and very short and therefore are of substantially reduced accuracy.

There is an unmet need for a practical method and integrated circuit structure for providing various combinations of the same or different high or low sheet resistances and the n same or different TCRs for two or more thin film resistors, each on a different player.

There also is an unmet need for a practical technique for providing a thin film resistor structure that can be used to offset the TCR of integrated circuit elements in which the TCR is not easily adjustable during integrated circuit manufacture.

There also is an unmet need for a way of manufacturing more stable thin film resistors in an integrated circuit process.

There also is an unmet need for an integration technique for providing two accurate SiCr thin film resistors having different sheet resistances and zero-value TCRs.

There also is an unmet need for an integration technique for providing two accurate SiCr thin film resistors, at least one of which has a precisely determined TCR, in an integrated circuit structure.

SUMMARY OF THE INVENTION

It is an object of the invention to provide a practical method and integrated circuit structure for providing various combinations of the same or different high or low sheet resistances and the same or different TCRs for two or more thin film resistors, each on a different layer.

It is another object of the invention to provide a practical technique for providing a thin film resistor structure that can be used to offset the TCR of integrated circuit elements in which the TCR is not easily adjustable during integrated circuit manufacture.

It is another object of the invention to provide a way of manufacturing more stable thin film resistors in an integrated circuit process.

It is another object of the invention to provide an integration technique for providing two accurate SiCr thin film resistors, at least one of which has a precisely determined TCR, in an integrated circuit structure.

It is another object of the invention to provide a thin film resistor having a large positive TCR in an integrated circuit which can be used to offset a negative TCR of another circuit element in the integrated circuit having a negative TCR.

It is another object of the invention to provide an integration technique for providing two accurate SiCr thin film resistors having different sheet resistances and zero-value TCRs.

Briefly described, and in accordance with one embodiment, the present invention provides an integrated circuit structure including multiple thin film resistors of the same or different sheet resistances and the same or different TCRs. The integrated circuit structure includes a first oxide layer (2) formed on a semiconductor substrate (1), a first thin film resistor (3) disposed on the first oxide layer (2), and a second oxide layer (14) disposed over the first oxide layer (2) and first thin film resistor (3). A second thin film resistor (15) is formed on the second oxide layer (14) and a third oxide layer (16) is formed over the second thin film resistor (15) and the second oxide layer (14). Interconnect metallization elements (12A,B & 22A,B) formed on at least one of the second (14) and third (16) oxide layers electrically contact the circuit element (4), terminals of the first thin film resistor (3), and terminals of the second thin film resistor (15), respectively, through corresponding contact openings in at least one of the second (14) and third (16) oxide layers. In the described embodiments, at least one of the first (3) and second (15) thin film resistors is composed of one of the group including sichrome (SiCr) and tantalum nitride (TaN).

Figure 19:
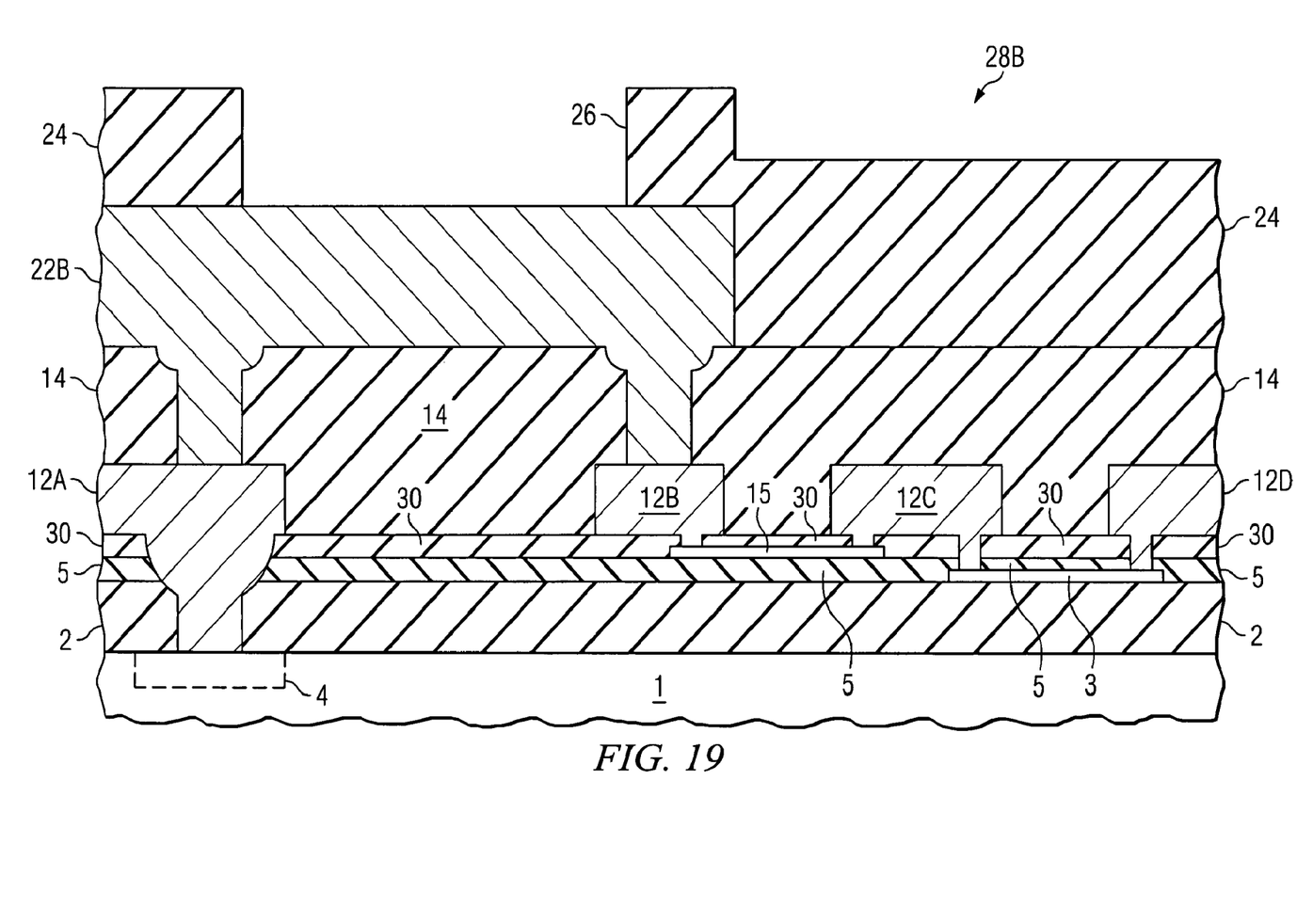

In one embodiment, some of the interconnect metallization elements are part of a first metallization layer (Metal 1)

formed on the third oxide layer (30 in FIG. 19) for providing electrical connection to a terminal of the circuit element (4) through a contact opening in the first (2), second (5), and third (30) oxide layers, for providing electrical connections to terminals of the second thin film resistor (15) through contact openings in the third oxide layer (30), and for providing electrical contact to terminals of the first thin film resistor (3) through contact openings in the second (5) and third (30) oxide layers. The integrated circuit structure further includes a fourth oxide layer (14) on the first metallization layer (Metal 1) and the third oxide layer (30), others of the interconnect metallization elements being included in a second metallization layer (Metal 2) on the fourth oxide layer (14) for providing electrical connections to various interconnect metallization elements of the first metallization layer (Metal 1) through contact openings in the fourth oxide layer (14).

In another embodiment, an intermediate oxide layer (5) is formed on the first oxide layer (2) and the first thin film resistor (3), the second oxide layer (14) being disposed on the intermediate oxide layer (5) and at least some of the interconnect metallization elements (12A,B,C). Some of the interconnect metallization elements are included in a first metallization layer (Metal 1) formed on the intermediate oxide layer (5) for providing electrical connection to a terminal of the circuit element (4) through a contact opening in the first (2) and intermediate (5) oxide layers and for providing electrical contact to terminals of the first thin film resistor (3) through contact openings in the intermediate oxide layer (5). Others of the interconnect metallization elements are included in a second metallization layer (Metal 2) formed on the third oxide layer (16) for providing electrical connections to terminals of the second thin film resistor (15) through contact openings in the third oxide layer (16) and for providing electrical connection to various interconnect metallization elements of the first metallization layer (Metal 1).

In the described embodiments, the first thin film resistor (3) can be a first SiCr resistor having a first sheet resistance and a first temperature coefficient of resistance, and the second thin film resistor (15) can be a second SiCr resistor (15) having a second sheet resistance and a second temperature coefficient of resistance. A vanadium silicide layer (8) may be formed between the a metallization element of the first metallization layer (Metal 1) on the terminal of the circuit element (4) at the bottom of the contact opening through the first (2) and fourth (5) oxide layers for providing the electrical connection between the metallization element and the terminal of the circuit element (4).

DETAILED DESCRIPTION OF THE PREFERRED EMBODIMENTS

FIGS. 1-11 illustrate a sequence of processing operations according to a first embodiment of the invention for fabricating a first thin film resistor structure including two thin film resistors composed of different thin film material having the same or different sheet resistances and also having the same or different TCRs.

Figure 1:
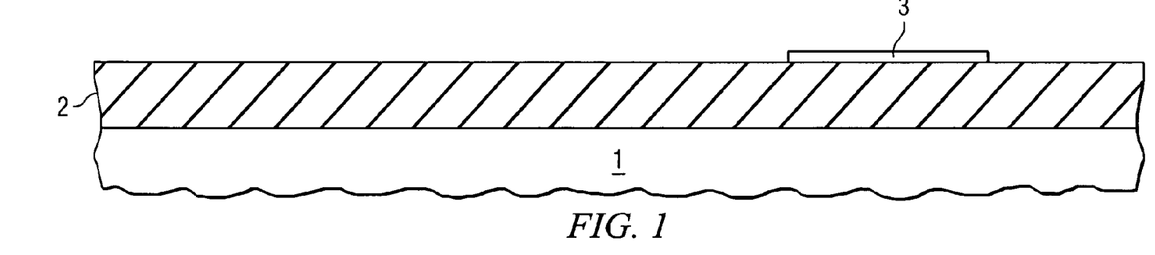
FIGS. 1-11 schematically illustrate successive process steps in the formation of a first thin film resistor structure according to the present invention.

FIG. 1 shows a starting silicon substrate 1 having a standard pre-metal dielectric layer 2 including a first TEOS (tetraethylorthosilicate) layer on silicon substrate 1, a BPTEOS (Boron-Phosphorus TEOS) layer on the first TEOS sublayer, and a second TEOS layer on the BPTEOS sublayer. A thin layer 3 of sichrome (SiCr) having a sheet resistance, typically in the range from 30 to 2000 ohms per square (based on previously developed curves of TCR versus sheet resistance for the particular SiCr deposition process), has been deposited on the upper surface of pre-metal dielectric layer 2. An anneal process has been performed to adjust the TCR of SiCr layer 3 to a desired (typically positive) value, and a conventional photoresist deposition, etching, and cleaning process has been performed to define the shape of SiCr resistor 3. The TCR versus sheet resistance curves establish the anneal cycle that is needed to cause the TCR of SiCr layer 3 to increase along one of the TCR versus Rs curves in FIG. 20 from a particular negative value to a desired (typically positive) target value. Conventional rapid thermal anneal (RTA) technology or conventional tube annealing can be used to accomplish the annealing cycle.

Figure 20:
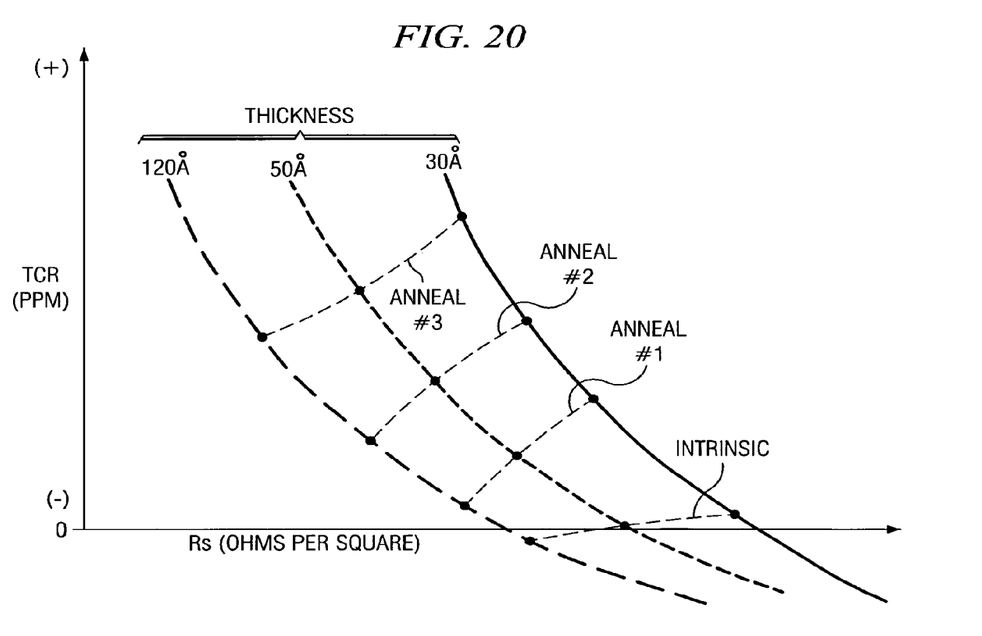
FIG. 20 is a graph including three empirical curves showing the change in sheet resistance Rs and TCR of thin film SiCr layers of various thicknesses as a function of durations of anneal cycles to which the layers are subjected.

FIG. 20 shows how anneal cycles affect the sheet resistance Rs and TCR of deposited SiCr layers of three different thicknesses. Specifically, FIG. 20 shows three TCR versus Rs curves for three deposited SiCr layers of 30, 50, and 120 Angstroms thickness. The dashed line labeled "Intrinsic" intersects the points of the three curves indicating the TCR in ppm (parts per million) and the Rs in ohms per square for the three deposited SiCr layers before any annealing. The dashed line labeled "Anneal #1" intersects the points of the three curves indicating the TCR in ppm (parts per million) and the sheet resistance Rs in ohms per square of the three deposited layers after the three SiCr layers have been subjected to a first anneal cycle of a predetermined time (e.g., 30 minutes) at a predetermined temperature, which typically is greater than 475 degrees Centigrade. The dashed line labeled "Anneal #2" intersects the points of the three curves indicating the TCR and the Rs of the three deposited layers after the three SiCr layers have been subjected to a second anneal cycle of a predetermined time, and the dashed line labeled "Anneal #3" intersects the points of the three curves indicating the TCR and the Rs of the three deposited layers after the three SiCr layers have been subjected to a third anneal cycle of a predetermined time.

Initially the TCR of the deposited SiCr layer is usually negative, and its TCR crosses zero and becomes positive with continued annealing. The curves of FIG. 20 show that SiCr layers can be annealed so as to achieve zero or positive values of TCR, depending on the amount of time and temperature at which the deposited SiCr film is annealed. The thinner SiCr layers tend to be more sensitive to further annealing.

It is important that the sheet resistance and TCR of bottom SiCr film 3 is subjected to thermal cycles in accordance with curves such as those shown in FIG. 20 prior to deposition of an interconnect metallization layer and also prior to deposition of another SiCr (or other composition) resistive layer, and it is preferable that no subsequently deposited thin film layer require annealing at temperatures that would change the TCR and sheet resistance of SiCr layer 3. Also, the presence of interconnect metallization deposited after the annealing of SiCr layer 3 would make determination of subsequent thermal cycles of the kind needed to adjust sheet resistance and TCR of a subsequently formed SiCr layer to desired target values much more difficult.

In accordance with one aspect of the present invention, the TCR of the bottom SiCr layer 3 is adjusted by suitable annealing before performing any further high temperature steps or metallization steps in the integrated circuit manufacturing process.

Figure 2:
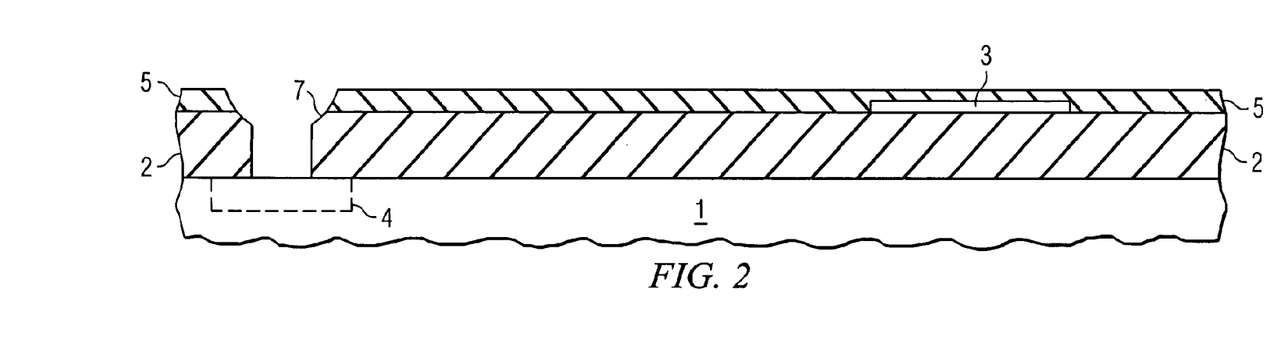

Referring to FIG. 2, a standard TEOS barrier layer 5 is formed on the upper surfaces of pre-metal dielectric layer 2 and SiCr resistor layer 3. After performing a photoresist procedure to define the locations of contact openings to expose electrodes/terminals of various other elements 4, such as transistors and diffused resistors (not shown) that are previously formed in silicon substrate 1, various contact openings 7 are etched through TEOS layer 5 and pre-metal dielectric layer 2 as illustrated.

Figure 3:
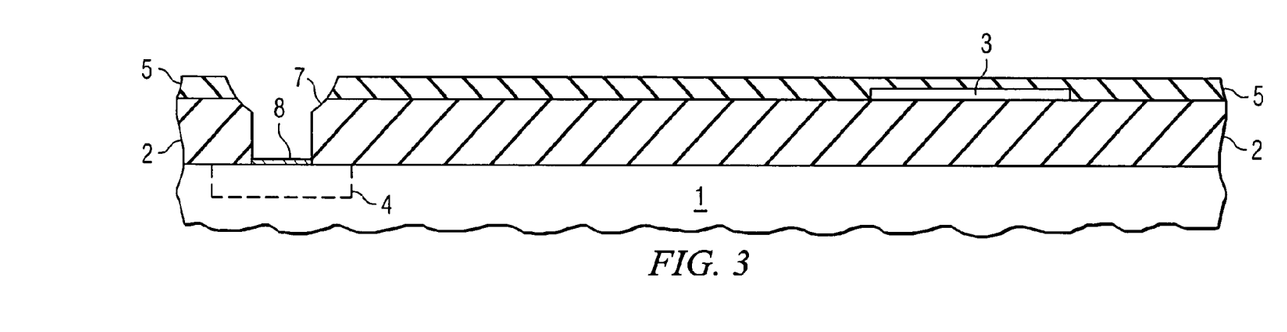

Referring to FIG. 3, a vanadium deposition is performed on the exposed upper surface of the wafer, including the bottoms of contact openings 7. The wafer then is subjected to a suitable temperature to cause formation of vanadium silicide layers 8 at the bottoms of the contact openings 7. Unreacted vanadium is removed from the rest of the exposed wafer surface to produce the structure as illustrated in FIG. 3. (Note that palladium silicide could be formed instead of vanadium silicide.)

Figure 4:
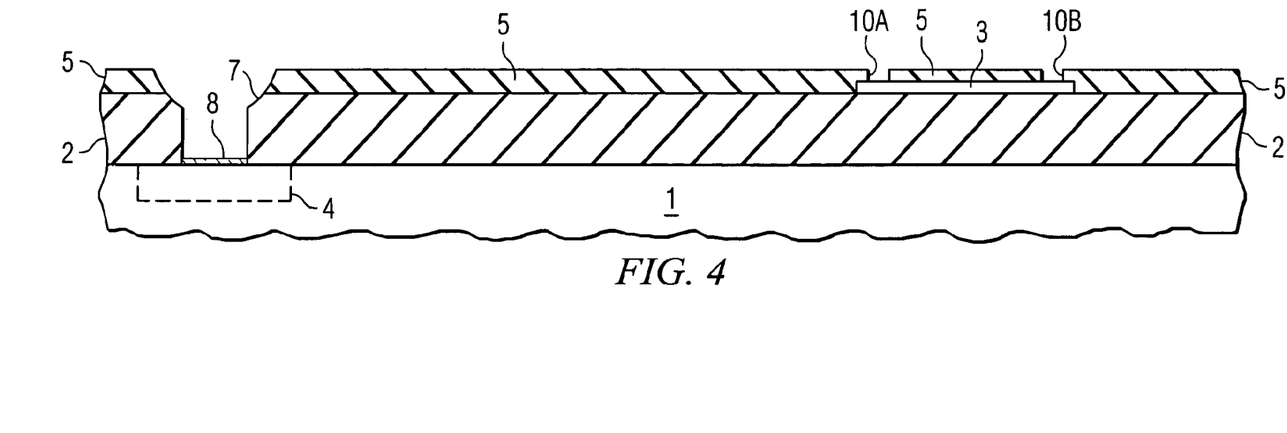

Referring to FIG. 4, a suitable photoresist operation and oxide etching procedure is performed to define contact openings 10A and 10B in TEOS barrier layer 5 to expose the contact areas of SiCr resistor 3.

Figure 5:
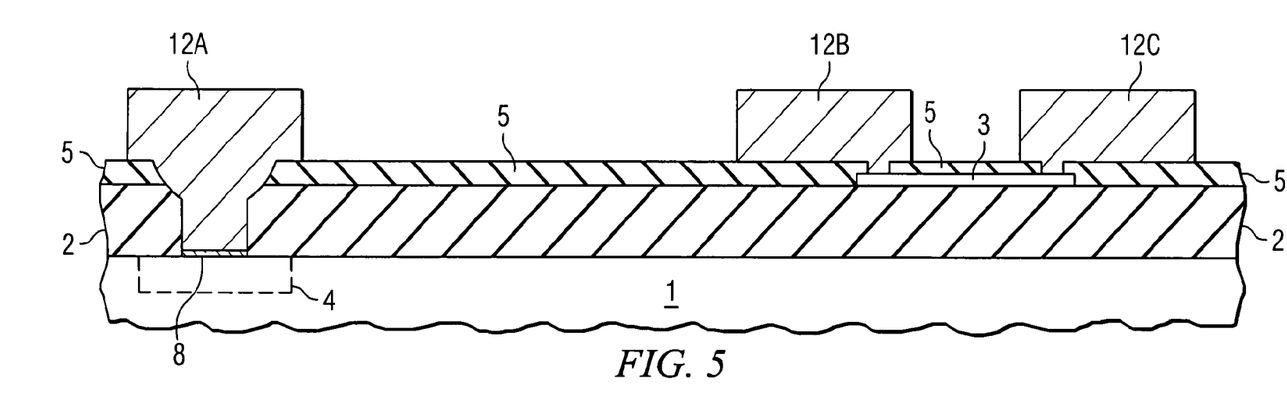

Referring to FIG. 5, a first metallization layer, referred to as the "Metal 1" layer is deposited on the exposed surface of the wafer. The Metal 1 layer fills the contact openings 7, making good electrical contact to the vanadium silicide layer(s) 8, and also fills the SiCr resistor via openings 10A and 10B to electrically contact both ends of SiCr resistor 3. The Metal 1 layer also contacts the above-mentioned electrodes and/or terminals of transistors, diffused resistors, etc. in/on silicon substrate 1 exposed by various contact openings 7. A suitable photoresist, metallization etching, and cleaning procedure produces the structure shown in FIG. 5.

Figure 6:
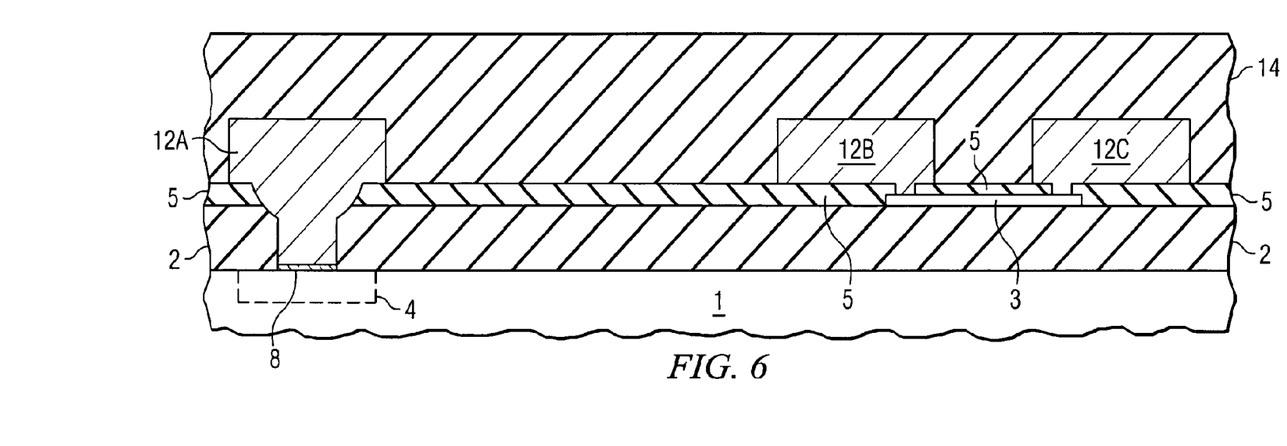

Referring to FIG. 6, the next step is to deposit a "TEOS liner" sublayer portion (not shown) of an oxide/dielectric layer 14 over the exposed wafer surface including the exposed oxide surface area and the Metal 1 surface area. Oxide layer 14 also includes a "FOx" spin-on sublayer layer on the above-mentioned TEOS liner sublayer to achieve a degree of planarization. The term "FOx" refers to "flowable oxide", is a trademark of Dow Corning, and is composed of hydrogen silsesquioxane ($HSio^{3/2}$). An annealing of the structure is performed in the presence of nitrogen gas or other suitable ambient. Finally, layer 14 is completed by depositing a TEOS "cap" sublayer on the FOx spin-on sublayer.

Figure 7:
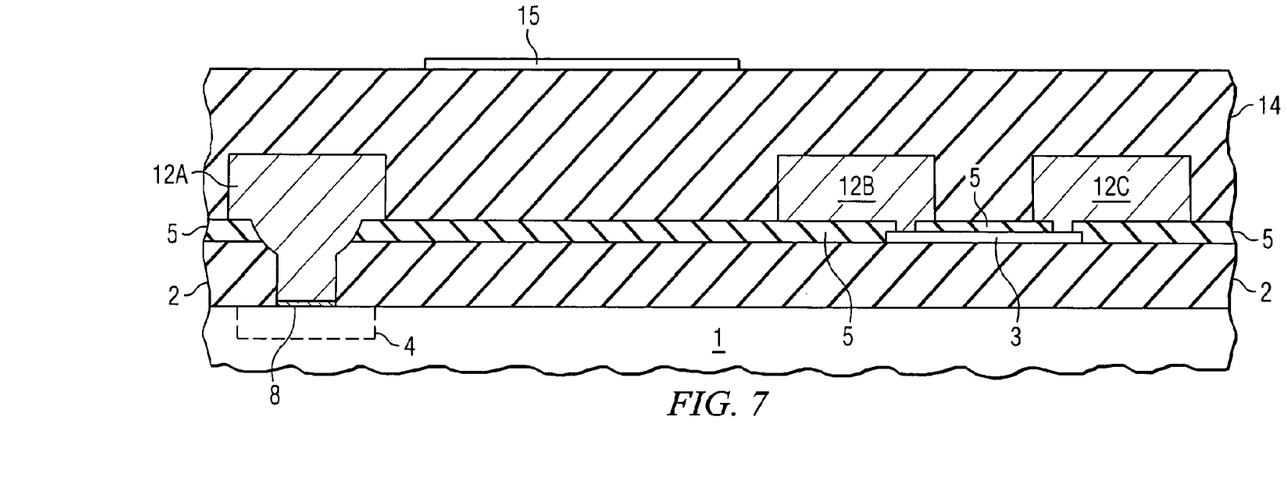

Referring to FIG. 7, the next step is to deposit a "high precision" second SiCr layer 15 having a sheet resistance which may be approximately 1000 ohms per square (although it may be in the range of approximately 30-2000 ohms per square) on the exposed surface of layer 14. The second SiCr layer 15 also has a target TCR value.

The second-deposited SiCr layer 15 typically is the one with higher sheet resistance, and the first-deposited SiCr layer 3 typically has a relatively low sheet resistance. The first-deposited SiCr layer 3 is preferably the one which is annealed as previously described to increase its TCR and to decrease its sheet resistance to desired target values, and the second-deposited SiCr layer 15 with high sheet resistance preferably is deposited with high precision sheet resistance and a TCR value of zero. If second-deposited SiCr layer 15 were to be annealed at a substantially high temperature for a substantially long duration, the same annealing process would also result in difficult-to-control changes in the sheet resistance and TCR of the first-deposited SiCr layer 3, and in this usually would be undesirable.

Figure 8:
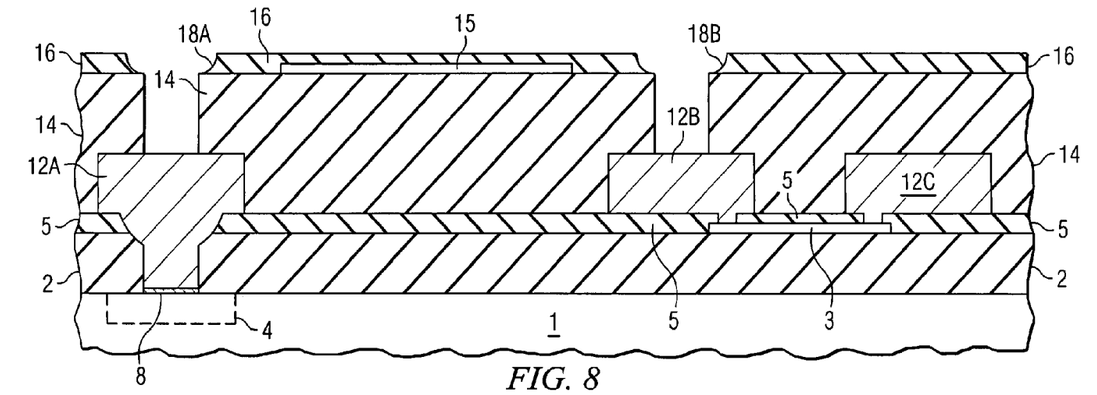

Referring to FIG. 8, the next step is to deposit a TEOS layer 16 on the exposed surface areas of oxide layer 14 and SiCr resistor layer 15, followed by a photoresist and etching procedure to define the locations and sizes of various via openings 18A and 18B extending down through oxide layer 16 and through oxide layer 14 to expose surfaces of various Metal 1 conductors 12A and 12B, as shown.

Figure 9:
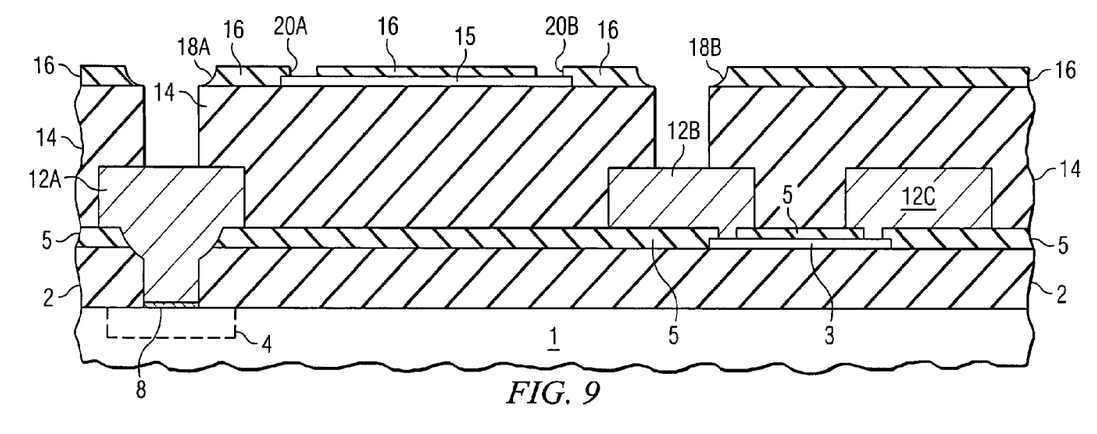
Figure 10:
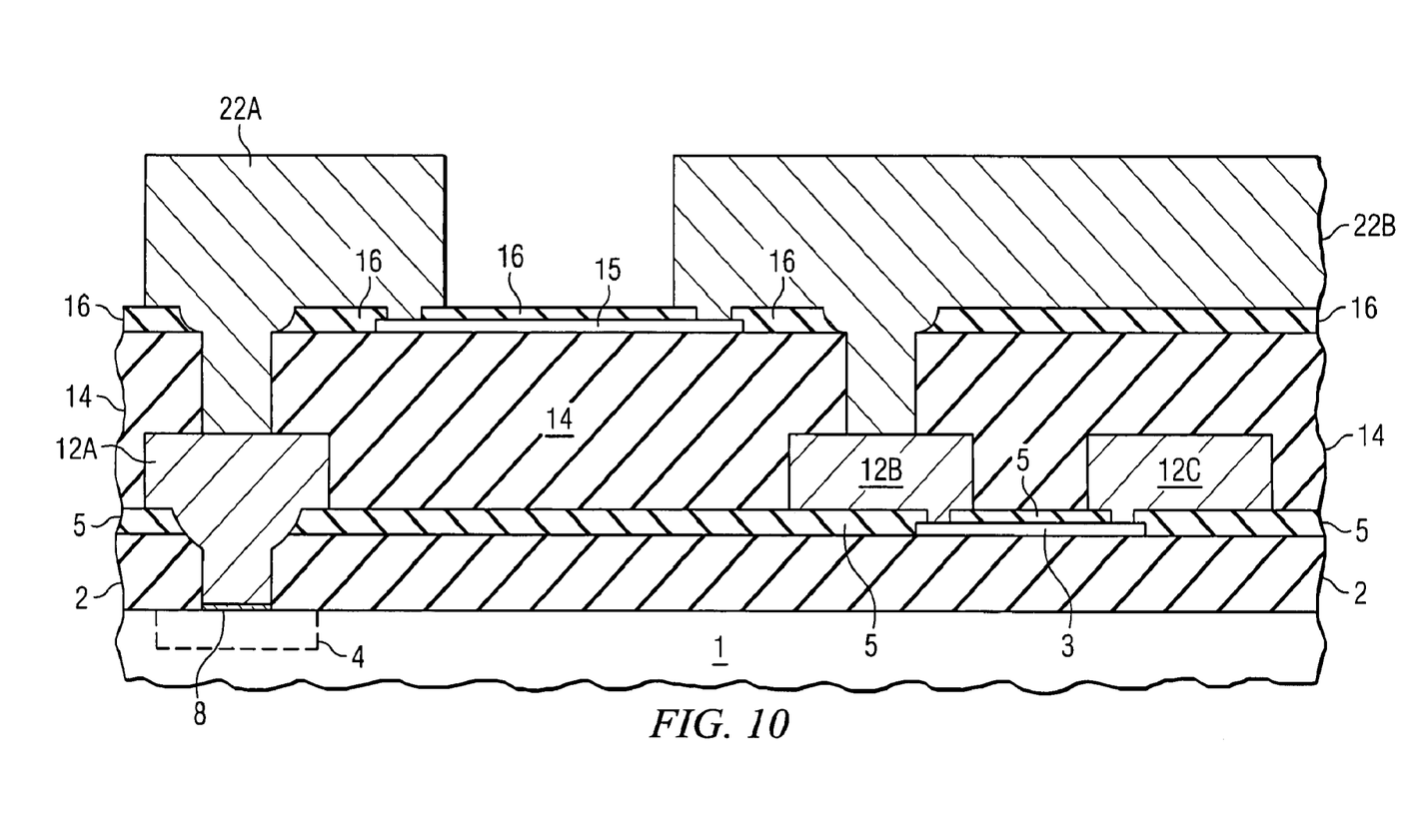

Referring to FIG. 9, the next step is to perform a photoresist and etching procedure to define the sizes and locations of via openings 20A and 20B through oxide layer 16 to expose the contact areas at the ends of SiCr resistor layer 15, as shown. Next, as shown in FIG. 10, a "Metal 2" metallization layer is deposited on the exposed wafer surface, extending through the contact openings 18A and 18B to electrically contact the exposed surfaces of Metal 1 conductors 12A and 12B, respectively, and also extending through resistor contact or via openings 20A and 20B to contact the ends of SiCr resistor 15, as shown. A photoresist and etching procedure defines the sizes and shapes of the Metal 2 conductors 22A and 22B as shown in FIG. 10.

The next step is to deposit (or spin on) a protective passivation layer 24, which may be SiON (silicon oxynitride), followed by a photoresist and etching procedure to define bonding pad openings such as bonding pad opening 26. This results in the integrated circuit thin film resistor structure 28A shown in FIG. 11.

The described embodiments of the invention provide the design engineer with a zero-TCR thin film resistor as an available circuit element. The invention also can provide to the design engineer a positive TCR resistor which can be used to offset negative TCs of other components such as bipolar and MOS transistors, diffused resistors, etc. This allows the design engineer to provide high precision "upper" level resistors such as resistor 15 which do not need to be adjusted or "tuned", and in the same integrated structure, to also provide other resistors such as "lower" level SiCr resistor 3 which can be adjusted or "tuned" by thermal annealing procedures to achieve the desired TCR. The resulting high precision resistor structure can be used at any node within a circuit requiring a stable resistor.

In a second embodiment of the invention, two different thin film SiCr layers of the same or different sheet resistances and different TCRs are integrated into a structure in which the two different SiCr layers can be interconnected by only the Metal 1 level of interconnect metallization, whereas in the embodiment of FIGS. 1-11, the second SiCr resistor 15 can only be electrically contacted by means of the Metal 2 interconnect metallization layer.

Figure 12:
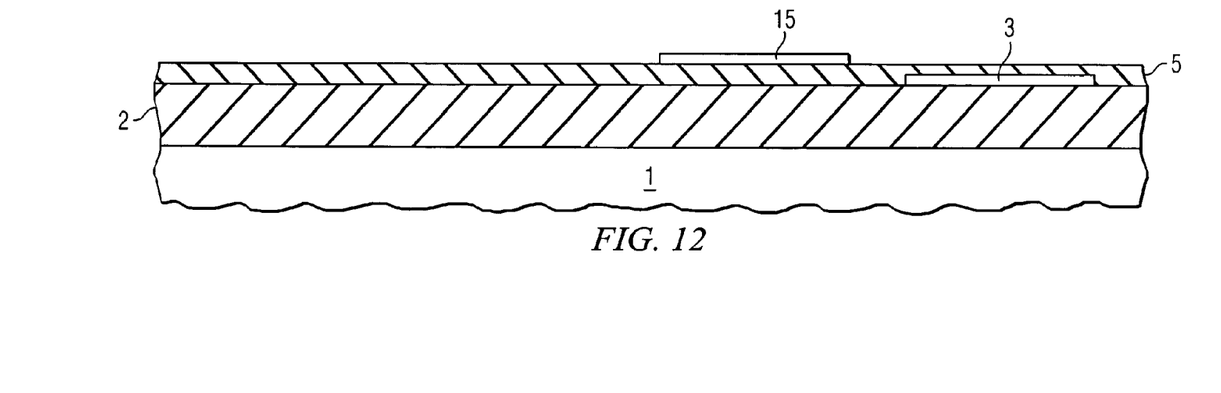
FIGS. 12-19 schematically illustrate successive process steps in the formation of a second thin film resistor structure according to the present invention.

The same wafer structure with SiCr layer 3 as shown in FIG. 1 is the starting point in making the second embodiment of the invention. FIGS. 12-19 illustrate a sequence of further processing operations according to the second embodiment of the invention for fabricating a thin film resistor structure including two thin film resistors including the same or different sheet resistances and the same or different TCRs, with the ability to adjust the TCR of the lower SiCr layer 3 so as to not affect the subsequently formed upper SiCr layer 15. Referring to FIG. 12, the first TEOS barrier layer 5 is formed on the upper surface of pre-metal dielectric layer 2 and SiCr resistor layer 3. The next step is to deposit the "high precision" second SiCr layer 15 having a sheet resistance in the range of approximately 30-2000 ohms per square and a precise target value of TCR on the exposed surface of first TEOS barrier layer 5. After performing a photoresist procedure to define the locations of contact openings to expose terminals of various other elements formed in silicon substrate 1, such as transistors and diffused resistors (not shown), various contact openings 7 are etched through TEOS layer 5 and pre-metal dielectric layer 2 as illustrated.

Figure 13:
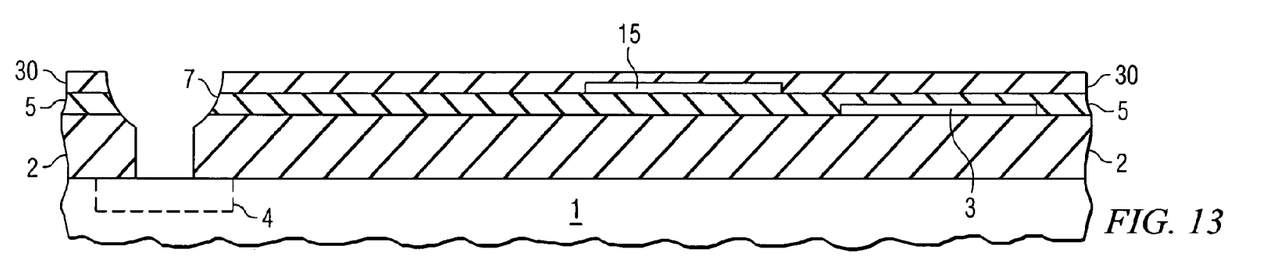
Figure 14:
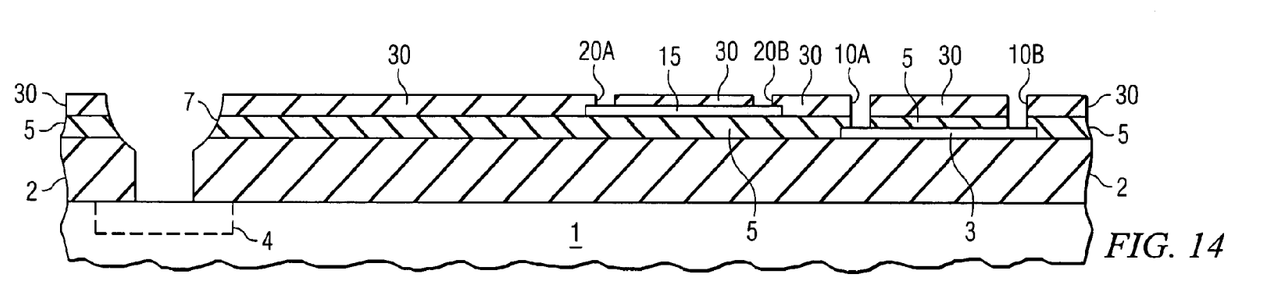

If desired, a vanadium deposition (as previously described with reference to FIGS. 3 and 4) could also be performed between the steps for providing the structures shown in FIGS. 13 and 14 to form vanadium silicide layers (such as vanadium silicide layer 8 in FIG. 4 on the bottoms of the contact openings 7. This would be done before etching of contact openings 10A,B or 20A,B.

Referring to FIG. 14, a suitable photoresist operation and oxide etching procedure is performed next to define contact openings 10A and 10B in first TEOS barrier layer 5, and to define via openings 20A and 20B in second TEOS barrier layer 30 and first TEOS barrier layer 5 to expose contact areas of SiCr resistors 15 and 3, respectively, as shown.

Figure 15:
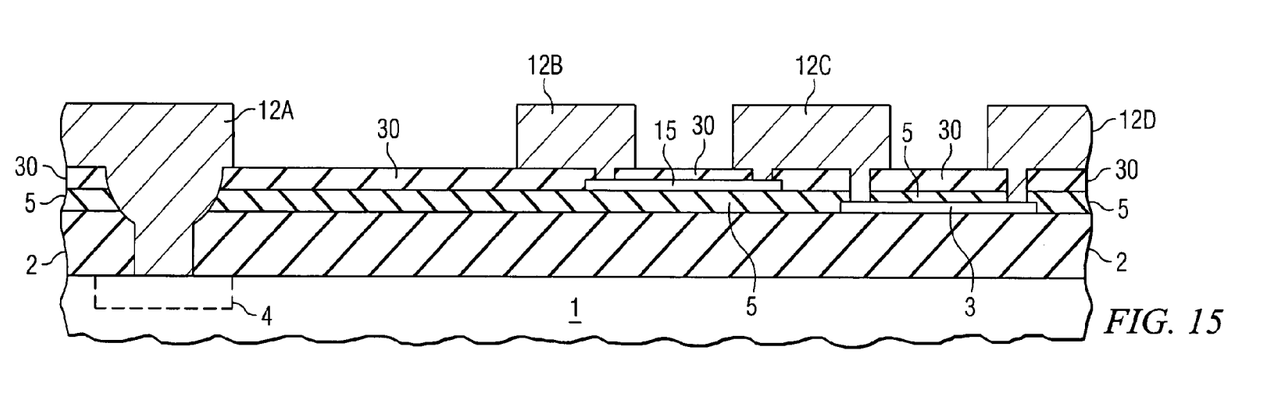

Referring to FIG. 15, a "Metal 1" metallization layer is deposited on the exposed surface of the wafer, filling the contact openings 7 to make electrical contact to electrode/terminals of various transistors, diffused resistors etc. (not shown) previously formed in region 4 of silicon substrate 1. The Metal 1 layer also fills the SiCr resistor via openings 10A and 10B to electrically contact both terminals of SiCr resistor layer 3 and also fills the contact openings 20A and 20B to electrically contact both terminals of SiCr resistor 15. A suitable photoresist, metallization etching, and cleaning procedure results in the structure as shown in FIG. 15.

Figure 16:
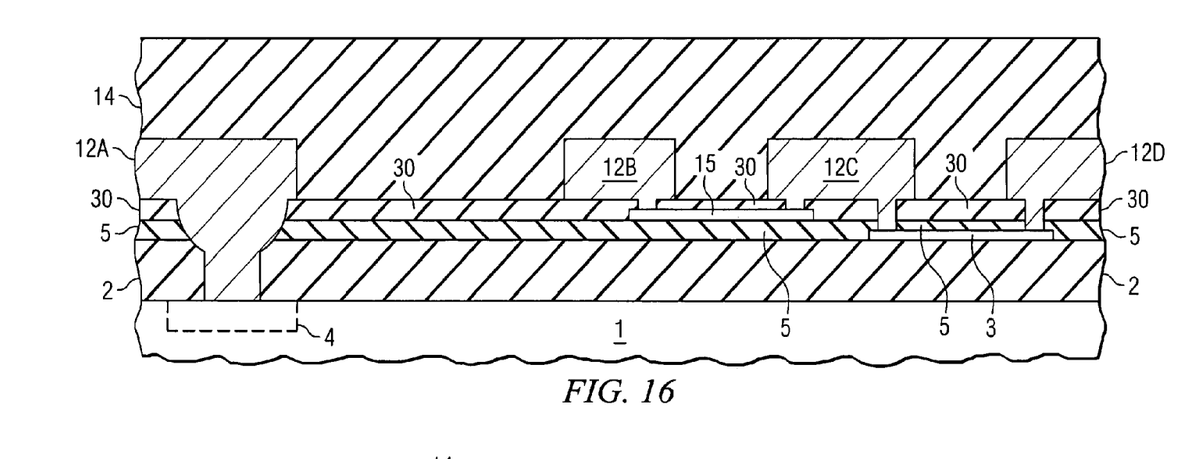

Referring to FIG. 16, the next step is to deposit a "TEOS liner" sublayer (not shown) of layer 14 over the exposed wafer surface including the exposed oxide surface area and the Metal 1 surface area. Layer 14 also includes a FOx spin-on sublayer layer on the TEOS liner sublayer to achieve a degree of planarization. An anneal in the presence of nitrogen gas is performed. Finally, layer 14 is completed by depositing a TEOS "cap" sublayer on the FOx spin-on sublayer layer.

Figure 17:
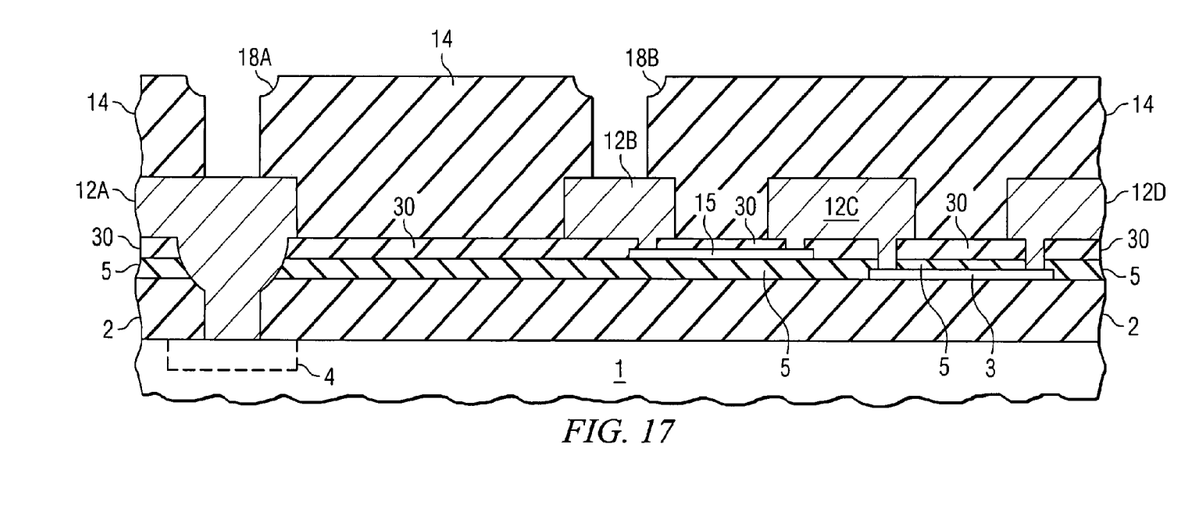

Referring to FIG. 17, the next step is to perform a photoresist and etching procedure to define the locations and sizes of various via openings 18A and 18B extending down through layer 16 and layer 14 to expose surfaces of various Metal 1 conductors 12A and 12B, as shown.

Figure 18:
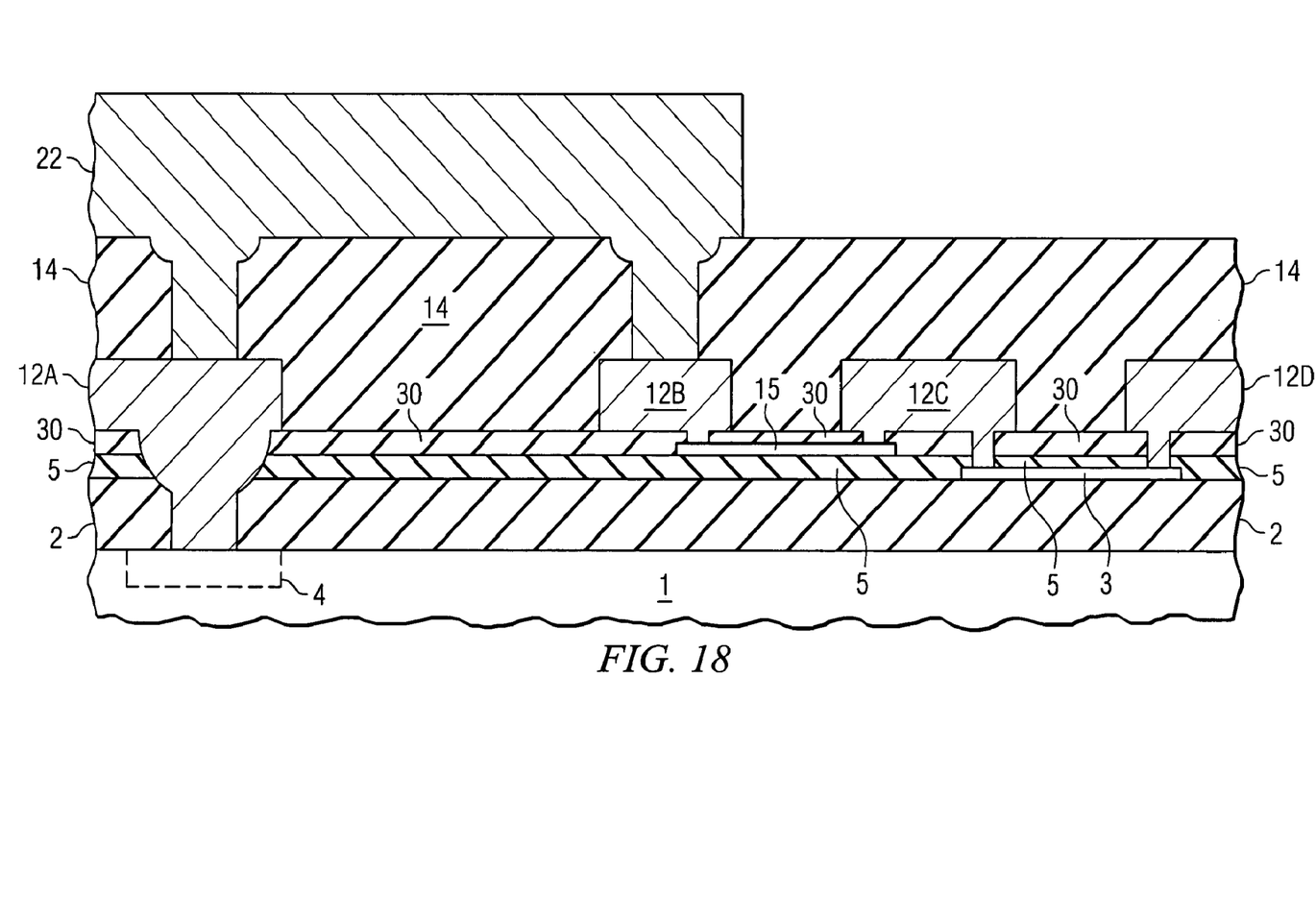

Next, as shown in FIG. 18, a second metallization "Metal 2" layer 22 is deposited on the exposed wafer surface, extending through the contact openings 18A and 18B to electrically contact the exposed surface areas of various Metal 1 conductors such as conductors 12A and 12B, respectively. After a photoresist and etching procedure, the various Metal 2 conductors 22 are defined generally as shown in FIG. 18.

Figure 11:
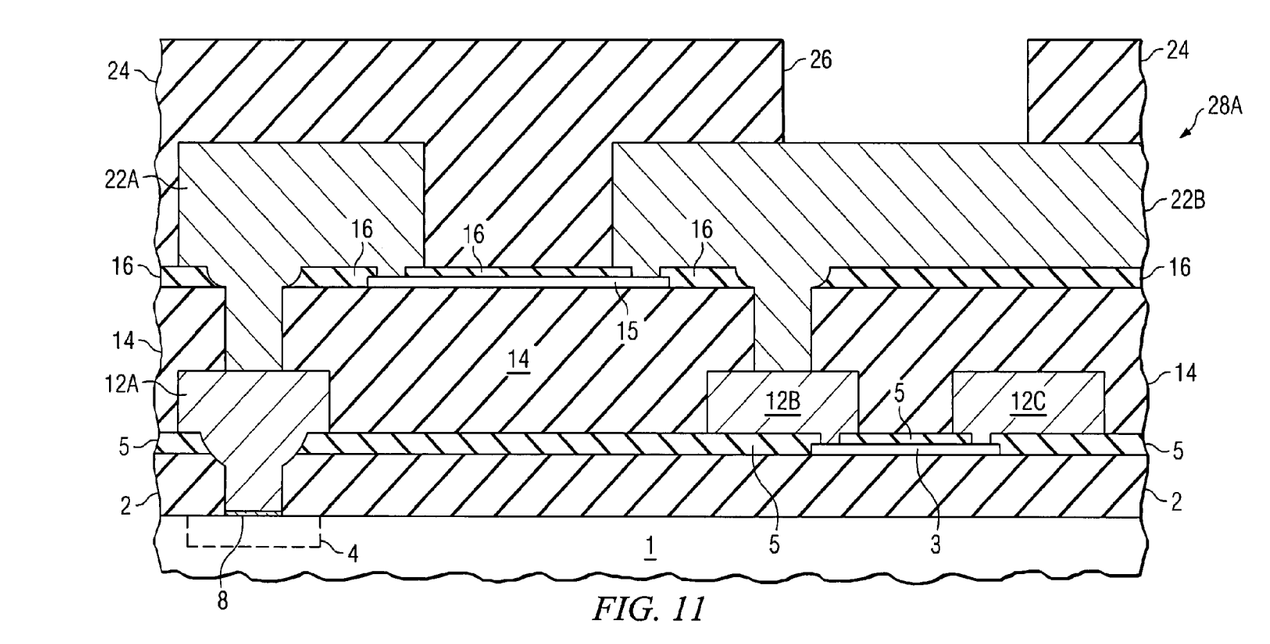

The next step is to form a protective passivation layer 24, which may be SiON, followed by a photoresist and etching procedure to define bonding pad openings such as bonding pad opening 26. This results in the integrated circuit thin film resistor structure 28B as shown in FIG. 11.

As in the embodiment of FIGS. 1-11, the first-deposited SiCr resistor 3 is integrated into the process, and then is annealed at higher temperatures (in accordance with empirical curves such as the ones shown in FIG. 20) before performing any additional high-temperature or other substantial processing steps, in order to reduce the sheet resistance Rs and shift the TCR of the SiCr resistor 3 to a more positive target value. (The annealing of SiCr resistor 3 also tends to improve its absolute stability.) The second-deposited, typically near-zero-TCR SiCr resistor 15 then is integrated at the same Metal 1 layer (as in FIGS. 1-11) or at the Metal 2 level in the integration (as in FIGS. 12-19).

The embodiment of FIGS. 12-19 can be advantageous when used in conjunction with a process that includes only a single layer of main interconnect metallization. This process/structure can be added to various integrated circuit processes which include only a single metallization layer, in cases wherein the pre-existing integrated circuit process can tolerate the annealing temperatures required for the SiCr layer 3.

It should be appreciated that lower resistor 3 and/or upper resistor 15 could be tantalum nitride (TaN). If lower resistor 3 is composed of TaN, then the above described additional annealing might not be necessary, because the adjustment of the TCR and sheet resistance Rs of a TaN resistor 3 could be accomplished by controlling the amount of other components, such as nitrogen, in the tantalum nitride film 3 as it is deposited. The sheet resistance for TaN resistors in this application could be in approximately the same 30 to 2000 ohms per square range for TaN thin film resistors as for SiCr thin film resistors.

An advantage of the invention is that it allows integration of a high-TCR component into a high precision integrated circuit process. The high-TCR component can be used to offset a negative TC of other complements/circuits on the die.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. Another application of the invention could be to deposit upper and lower thin film resistors, where all of the laser-trimmable resistors are provided on the upper level to make them accessible for laser trimming. Other silicide layers, such as cobalt silicide or nickel silicide, could be used instead of vanadium silicide.

What is claimed is:

1. A method of making an integrated circuit structure comprising:
    (a) forming a first thin film resistor on a first oxide layer disposed on a semiconductor substrate having a circuit element therein;
    (b) forming a second oxide layer over the first oxide layer and the first thin film resistor;
    (c) forming a second thin film resistor on the second oxide layer;
    (d) forming a third oxide layer over the second thin film resistor and the second oxide layer; and
    (e) forming interconnect metallization elements on at least one of the second and third oxide layers for electrically contacting a terminal of the circuit element, terminals of the first thin film resistor, and terminals of the second thin film resistor, respectively, through corresponding contact openings in at least one of the second and third oxide layers;
    wherein the first thin film resistor and the second thin film resistor have different sheet resistances and different temperature coefficients of resistance; and wherein the temperature coefficient of resistance of the first thin film resistor is adjusted by performing an anneal of the first thin film resistor prior to forming the second thin film resistor and prior to forming the interconnect metallization elements.

2. The method of claim 1, wherein at least one of the first and second thin film resistors is composed of one of the group including sichrome (SiCr) and tantalum nitride (TaN).

3. The method of claim 1, wherein step (c) includes forming the second oxide layer directly on the first oxide layer.

4. The method of claim 3, including forming a first metallization layer on the third oxide layer, wherein some of the interconnect metallization elements are part of the first metallization layer for providing electrical connection to the terminal of the circuit element through a contact opening extending through the first, second, and third oxide layers, for providing electrical connections to terminals of the second thin film resistor through contact openings in the third oxide layer, and for providing electrical contact to terminals of the first thin film resistor through contact openings in the second and third oxide layers.

5. The method of claim 4, including forming a fourth oxide layer on the first metallization layer and the third oxide layer, others of the interconnect metallization elements being included in the second metallization layer, the method also including providing electrical connections to various interconnect metallization elements of the first metallization layer through contact openings in the fourth oxide layer.

6. The method of claim 1, wherein the first thin film resistor is composed of SiCr; the first thin film resistor sheet resistance has a value in the range from 30 to 2000 ohms per square; and the second thin film resistor sheet resistance has a value in the range from 30 to 2000 ohms per square.

7. The method of claim 1, wherein step (c) includes forming a fourth oxide layer on the second oxide layer and the first thin film resistor, forming a first metallization layer on the fourth oxide layer wherein some of the interconnect metallization elements are part of the first metallization layer for providing electrical connection to the terminal of the circuit element through a contact opening extending through the first and fourth oxide layers, and providing electrical connection to terminals of the first thin film resistor through contact openings in the fourth oxide layer.

8. A method of making an integrated circuit structure including multiple thin film resistors having different sheet resistances, comprising:
  (a) forming a first oxide layer on a semiconductor substrate having a circuit element therein; including forming the first oxide layer as a pre-metal dielectric layer including first TEOS, BPTEOS, and second TEOS portions;
  (b) forming a first thin film resistor on the first oxide layer disposed;
  (c) forming a second oxide layer over the first oxide layer and the first thin film resistor;
  (d) forming a second thin film resistor on the second oxide layer;
  (e) forming a third oxide layer over the second thin film resistor and the second oxide layer; and
  (f) forming interconnect metallization elements on at least one of the second and third oxide layers for electrically contacting a terminal of the circuit element, terminals of the first thin film resistor, and terminals of the second thin film resistor, respectively, through corresponding contact openings in at least one of the second and third oxide layers.

9. A method of making an integrated circuit structure, comprising:
  forming a first layer of resistor material having a first sheet resistance and a first temperature coefficient of resistance over a pre-metal dielectric layer over a semiconductor substrate having a circuit element therein;
  annealing the first layer of resistor material to adjust at least one of the first sheet resistance and the first temperature coefficient of resistance;
  patterning the first layer of resistor material to define a first resistor;
  forming a first oxide layer over the pre-metal dielectric layer and over the first resistor;
  forming contact openings through the first oxide layer and pre-metal dielectric layer;
  after annealing, forming a first metallization layer over the first oxide layer and within the contact openings;
  patterning the first metallization layer to define contacts for the first resistor and for the circuit element;
  forming a second oxide layer over the first oxide layer and over the contacts;
  forming a second layer of resistor material having a second sheet resistance and a second temperature coefficient of resistance over the second oxide layer; the second sheet resistance and second temperature coefficient of resistance being different than the first sheet resistance and first temperature coefficient at least after annealing; and
  patterning the second layer of resistor material to define a second resistor.

10. The method of claim 9, wherein the first and second layers of resistor material comprise first and second layers of sichrome material.

11. The method of claim 10, wherein annealing the first layer of resistor material adjusts the first temperature coefficient of resistance from a negative to a positive value.

12. The method of claim 11, wherein the second temperature coefficient of resistance is near zero.

13. The method of claim 9, wherein the annealing decreases the first sheet resistance and increases the first temperature coefficient of resistance.

14. The method of claim 13, wherein, after annealing, the second sheet resistance is higher than the first sheet resistance, and the second temperature coefficient of resistance is lower than the first temperature coefficient of resistance.

15. The method of claim 14, wherein the first temperature coefficient of resistance is a positive value, and the second temperature coefficient of resistance is near zero.

16. The method of claim 15, wherein the second sheet resistance determined without annealing has a value of about 1000 ohms or more; and the first sheet resistance after annealing has a relatively low value.

17. The method of claim 9, further comprising forming a third oxide layer over the second oxide layer and over the second resistor; forming interconnect openings through the second and third oxide layers; and forming a second metallization layer to define an interconnect between the second resistor and the first resistor.

* * * * *